US006919385B2

(12) United States Patent
Hayashi

(10) Patent No.: US 6,919,385 B2
(45) Date of Patent: Jul. 19, 2005

(54) ENERGY-RAY CURING RESIN COMPOSITION

(75) Inventor: Noriya Hayashi, Aichi-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 10/357,380

(22) Filed: Feb. 4, 2003

(65) Prior Publication Data

US 2003/0176525 A1 Sep. 18, 2003

Related U.S. Application Data

(62) Division of application No. 09/664,332, filed on Sep. 18, 2000.

(30) Foreign Application Priority Data

Sep. 24, 1999 (JP) ........................................ 1999-269648

(51) Int. Cl.$^7$ ............................ B32B 27/38; C08F 2/48; C08G 59/34; C08L 63/00
(52) U.S. Cl. ........................... 522/25; 428/413; 522/29; 522/66; 522/90; 522/96; 522/99; 522/100; 522/103; 522/104; 522/107; 522/148; 522/172; 522/178; 522/180; 522/181; 522/183; 522/186
(58) Field of Search ........................... 528/412; 522/25, 522/29, 66, 90, 96, 99, 100, 103, 104, 107, 148, 172, 178, 180, 181, 183, 186; 428/413

(56) References Cited

U.S. PATENT DOCUMENTS

| 4,252,592 A | 2/1981 | Green | |
|---|---|---|---|
| 4,299,938 A | 11/1981 | Green et al. | |
| 4,707,432 A | 11/1987 | Gatechair et al. | ........... 430/281 |
| 4,985,340 A | 1/1991 | Palazzotto et al. | ........... 430/270 |
| 5,047,376 A | * 9/1991 | Baumann et al. | .............. 502/5 |
| 5,242,715 A | 9/1993 | Schoen et al. | .............. 427/386 |
| 5,359,017 A | 10/1994 | Hamazu et al. | |
| 5,384,339 A | 1/1995 | Starkey | |
| 5,747,599 A | 5/1998 | Ohnishi | |
| 5,879,859 A | 3/1999 | Buchwalter et al. | |
| 6,150,435 A | 11/2000 | Bayer et al. | ................. 523/434 |
| 6,166,100 A | 12/2000 | Hiwara et al. | |
| 2002/0004353 A1 | * 1/2002 | Hayashi | ........................ 445/24 |

FOREIGN PATENT DOCUMENTS

| DE | 19750147 | 5/1999 | |
|---|---|---|---|
| DE | 197 50147 | 5/1999 | |
| EP | 0 504 569 | 5/1992 | |
| EP | 0 504 569 A2 | 9/1992 | |
| EP | 0 720 995 A2 | 7/1996 | |
| EP | 945475 A1 | 9/1999 | |
| GB | 1526923 | 10/1978 | |
| JP | 57-208210 | 12/1982 | |
| JP | 58-206622 | 12/1983 | |
| JP | 61-038023 | 2/1986 | |
| JP | 61-38023 | 8/1986 | |
| JP | 61-203120 | 9/1986 | |
| JP | 3-200761 | 9/1991 | |
| JP | 06192389 A | * 7/1994 | ........... C08G/59/20 |
| JP | 06-209153 | 7/1994 | |
| JP | 07-064072 | 3/1995 | |
| JP | 07-252344 | 10/1995 | |
| JP | 8-283388 | 10/1996 | |
| JP | 08-290572 | 11/1996 | |
| JP | 09-071636 | 3/1997 | |
| JP | 10-120766 | 5/1998 | |
| JP | 10-245431 | 9/1998 | |
| JP | 11-124490 | 5/1999 | |
| JP | 11-147285 | 6/1999 | |
| JP | 11-191320 | 7/1999 | |
| JP | 11-242111 | 9/1999 | |
| JP | 11-279449 | 10/1999 | |
| JP | 2000-169553 | 6/2000 | |
| JP | 2001-002760 | 1/2001 | |
| JP | 2001-092130 | 4/2001 | |
| JP | 2002-518579 | 6/2002 | |
| WO | WO 99/20674 A1 | 4/1999 | |
| WO | WO 99/67343 | 12/1999 | |

OTHER PUBLICATIONS

Patent Abstract of Japan, vol. 009, No. 066 (C–271), Mar. 26, 1985 Dec. 11, 1984.
Patent Abstract of Japan, vol. 009, No. 006 (C–271), Mar. 1985 and JP 59 199714 Dec. 11, 1984.
Chemical abstracts registry no. 32760–80–8 for n5–2, 4–cyclopentadien–1–yl)[(1,2,3,4,5, 6–n)–(1–methylethyl)benzene]–iron(1+)hexafluorophosphate(1–), for Irgacure 261, 1999.*

* cited by examiner

Primary Examiner—Robert Sellers
(74) Attorney, Agent, or Firm—Armstrong, Kratz, Quintos, Hanson & Brooks, LLP

(57) ABSTRACT

An energy-ray curing resin composition comprising a photopolymerizable resin component which can be cured by irradiation with an energy ray, a photopolymerization initiator component which makes it possible to cure the above photopolymerizable resin component by irradiation with an energy ray and a curing agent component used for curing at least one of the above photopolymerizable resin components by a method other than irradiation with an energy ray. To provide a high curability energy-ray curing resin composition which has a very high curing capacity as compared with those of conventional energy-ray curing resins and which is simple and has a high design freedom.

18 Claims, 2 Drawing Sheets

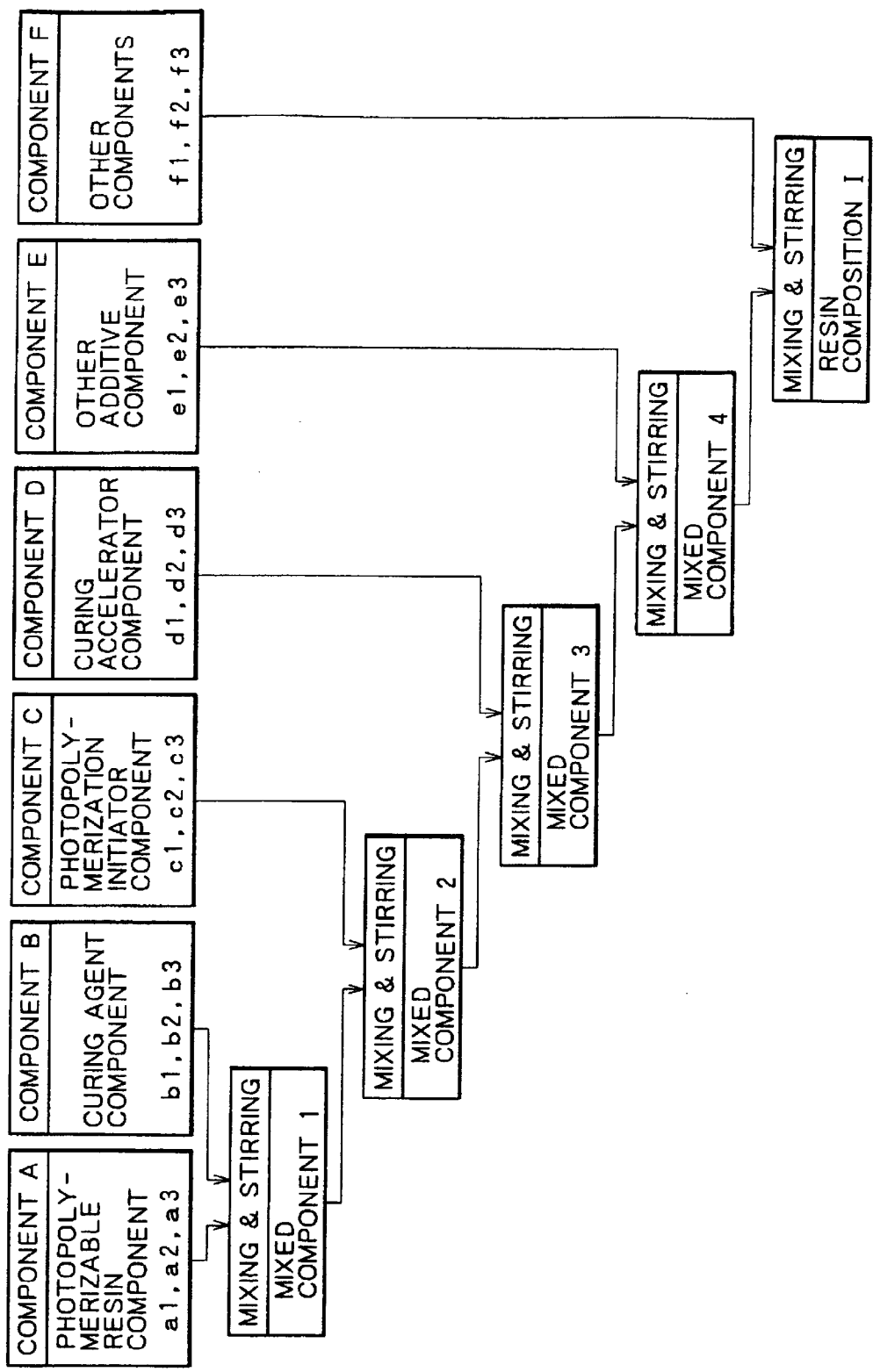

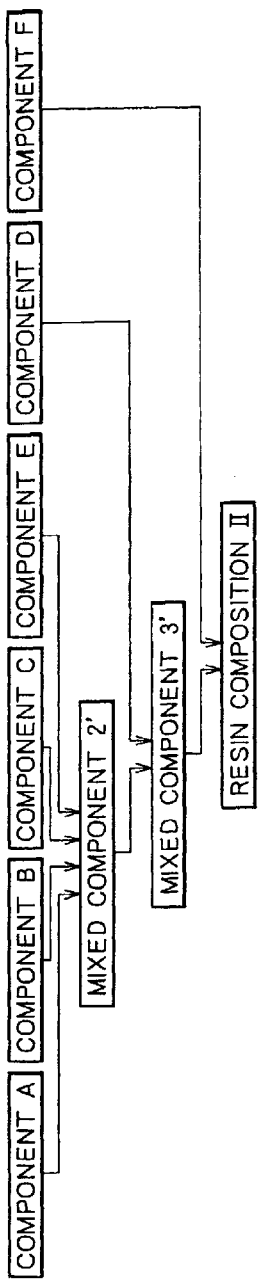
F I G. 2A
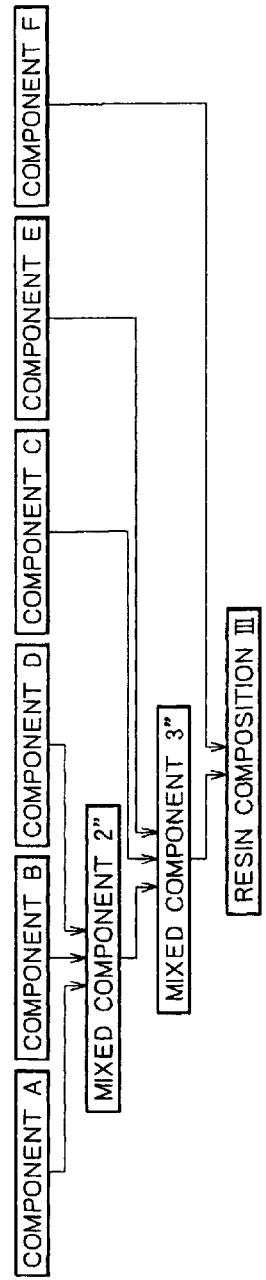
F I G. 2B
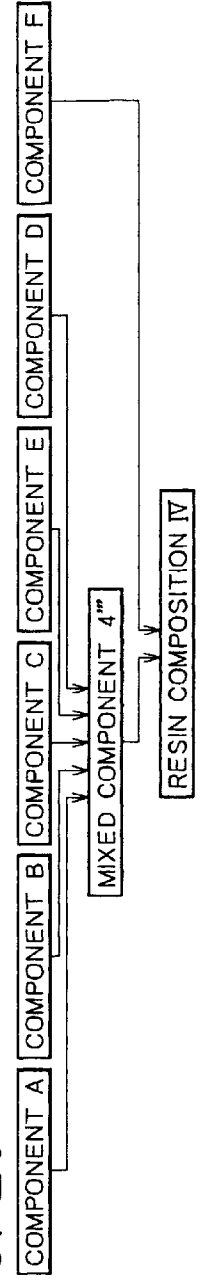
F I G. 2C

ENERGY-RAY CURING RESIN COMPOSITION

This application is a divisional of application Ser. No. 09/664,332 filed Sep. 18, 2000, pending.

FIELD OF THE INVENTION

The present invention relates to a composition which can be cured by an energy ray such as UV (ultraviolet ray), EB (electron beam), an infrared ray, an X-ray, a visible ray, a laser ray of argon, $CO_2$ or excimer lasers, sunlight and a thermal ray such as emission and radiation, and to a so-called energy-ray curing resin composition having high curability.

In particular, the present invention relates to a resin composition which has improved curability based on an energy-ray curing resin composition, and a production process for such composition with improved curability.

The resin composition described above is effective regardless of a light-sensitive agent, a photosensitizer, a reactive diluent and other fillers and additives each used for an energy-ray curing resin. Further, it is effective regardless of forms of fillers and additives, the presence of UV-shielding properties and the film thickness and form of the cured product by using a suited photopolymerization initiator component (for example, photo-thermopolymerization initiator and chain-curing type photopolymerization initiator components). It is applicable to various fields to which the curing resin can be applied, such as general molding materials and injection-molding materials and in addition thereto, paste materials, composite materials, grinding stone materials, adhesives, shielding materials, vanishes, paints, inks, toners and coating materials.

BACKGROUND OF THE INVENTION

In recent years, from viewpoints of cost reduction, ease of molding, improved workability, productivity, improved handling and processing, energy saving, space saving, increased safety, and stricter environmental protection, it has so far been investigated in various fields to use energy-ray curing resins which are characterized by energy-ray curing such as UV curing. However, insufficient energy-ray curing capability has been given as a factor which inhibits their use.

Energy-ray curing resins such as UV-curing resins is characterized by that only a part irradiated with a certain amount or more of an energy ray is cured, and energy rays such as UV rays are attenuated in the course of transmitting through the resin, so that energy-ray curing is influenced to a large extent by a curing capacity of the resin itself and the intensity, irradiation time and attenuation characteristic of the energy ray.

In order to expand the utilization of this technique and apply it to various fields in the future, higher curing capacities are required in many cases, and methods which have so far been carried out in order to improve an energy-ray curing capacity include an improved performance of a photoinitiator, a rise in the intensity of an energy ray irradiated, an extension of the irradiating time, and a change in the kind of energy rays.

However, when employing the methods described above, time and cost required for developing an initiator and expensive resin compositions have been considered as problems concerning the resin composition. Also, problems such as the requirement of larger apparatuses, increased energy consumption, higher running costs, reduced productivity, special requirements on ray sources, high costs of the apparatuses and the facilities and reduced safety have been involved with respect to energy ray irradiation apparatuses and facilities. Thus, it is difficult to use and apply the above-mentioned methods unless problems such as lost advantages of using energy rays and increased total costs are solved.

For example, a cured film thickness of an ordinary energy-ray curing resin is several $\mu$m to several mm on a surface which is effectively reached by an energy ray, and if a transmitting distance is extended, an effective amount of the energy ray does not reach, and portions beyond a certain depth are not cured. In order to improve the curing capacity, considered are, excluding the degree of the effects thereof, a change in the resin composition, an increase in the intensity of an energy ray irradiated, and a change in the ray source. In this case, however, problems similar to those discussed above also arise.

Accordingly, applicable fields of energy-ray curing have so far been limited to areas such as photoresists, coatings, paints, adhesives, varnishes and the like.

Representative examples for improving the energy-ray curing capacity include a high UV-curing resin (active energy-ray curing composition disclosed in Japanese Patent Application Laid-Open No. 8-283388, filed in the name of Mitsubishi Rayon Co., Ltd.) and UV-heat combined curing type resins (Optomer KS series by Asahi Denka Ind. Co., Ltd.; Redicure by Hitachi Kasei Ind. Co., Ltd.; UE resins by Toyo Boseki Co., Ltd.; and Japanese Patent Publication (Kokoku) No. 61-38023).

However, conventional high curability energy-ray curing resins represented by a high UV-curing resin have so far been dependent on the development of novel photopolymerizable initiators which are effective for energy-ray curing or, though examples thereof are fewer than the above, on the development of novel photopolymerizable oligomers. The problems described above are also involved therein, and it is hardly recognized possible to readily obtain compositions suitable to particular uses. Also, the UV-heat combined curing type resins have broader curing conditions. On the other hand, they have the same problems as those associated with the high-curability energy-ray curing resins. Further, the requirement of a heating process leads to the necessity of heating devices and related facilities, so that the advantages of energy-ray curing techniques are reduced with respect to overall requirements or apparatuses and facilities.

SUMMARY OF THE INVENTION

Accordingly, in light of the preceding problems associated with conventional energy-ray curing resins, the requirement for an improved curing capacity, the problems of the conventional high curability energy-ray curing resins, and the defective method for improving a curing capacity, the present inventors have intensively researched among novel high-curability energy-ray curing resin compositions.

As a result, the present inventors have found that a novel high-curability energy-ray curing resin composition comprising a photopolymerizable resin component, a photopolymerization initiator component, and a curing agent component which cures the above photopolymerizable resin component without irradiate on of an energy ray, and an energy-ray curing resin composition comprising a curing accelerator component which accelerates curing without irradiation of an energy ray provide higher curing capacities than those of conventional energy-ray curing resins, are simple to used, and have a high degree of design freedom, whereby the above-mentioned problems associated with conventional energy-ray curing resins are solved.

That is, the object of the present invention can effectively be achieved by the following compositions:

(1) An energy-ray curing resin composition comprising a photopolymerizable resin component which can be cured by irradiation with an energy ray, such as a photopolymerizable oligomer or a photopolymerizable monomer, a photopolymerization initiator component which is capable of curing the above photopolymerizable resin component upon irradiation of an energy ray, and a curing agent component which is capable of curing at least one of the above photopolymerizable resin components without irradiation of an energy ray, such as room temperature or heat curing agent.

(2) The energy-ray curing resin composition as described in the above item (1), further comprising a curing accelerator component which accelerates curing when curing at least one of the above photopolymerizable resin components and the above curing agent component without irradiation of an energy ray, such as room temperature curing or heat curing.

(3) The energy-ray curing resin composition as described in the above item (1) or (2), comprising an epoxy resin component having a cyclic ether structure in a molecular structure as the photopolymerizable resin component.

(4) The energy-ray curing resin composition as described in any of the above items (1) to (3), comprising an acid anhydride or a derivative thereof such as dicarboxylic acid or an esterified product thereof as the curing agent component.

(5) The energy-ray curing resin composition as described in any of the above item (1) to (3), comprising monohydric or polyhydric alcohols as the curing agent component.

(6) The energy-ray curing resin composition as described in the above item (2) or (3), comprising an acid anhydride or a derivative thereof and monohydric or polyhydric alcohols as the curing agent component or the curing accelerator component.

(7) The energy-ray curing resin composition as described in any of the above item (3) to (6), wherein the curing agent component or the curing accelerator component comprises a compound which can react with the epoxy resin component described above and which does not have a nitrogen atom in a molecular structure.

(8) The energy-ray curing resin composition as described in any of the above items (3) to (7), comprising 3,4-epoxycyclohexylmethyl-3,4-epoxycyclohexanecalboxylate as the photopolymerizable resin component.

(9) The energy-ray curing resin composition as described in the above item (4) or any of the above items (6) to (8), comprising maleic anhydride or a derivative thereof as the acid anhydride or derivative thereof described above.

(10) The energy-ray curing resin composition as described in any of the above items (5) to (8), comprising polyethylene glycol as the alcohols described above.

(11) The energy-ray curing resin composition as described in any of the above items (1) to (10), wherein the curing agent component described above is contained in a proportion of 0.1 to 1.4 mol per mol of the photopolymerizable resin component described above which can react with the curing agent component.

(12) The energy-ray curing resin composition as described in the above item (2), (3) or any of the above items (6) to (11), wherein the curing accelerator component described above is contained in a proportion of 0.04 to 0.6 mol per mol of the curing agent component described above.

(13) The energy-ray curing resin composition as described in any of the above items (1) to (12), comprising a cationic photopolymerization initiator component as the photopolymerization initiator component described above.

(14) The energy-ray curing resin composition as described in any of the above items (1) to (13), comprising an iron-allene base compound represented by the following Formula (I), (II) or (III) as the photopolymerization initiator component described above:

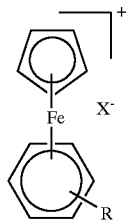

(I)

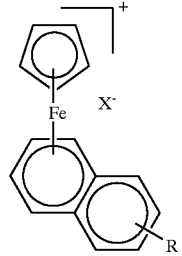

(II)

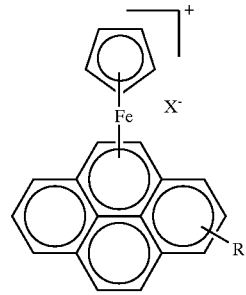

(III)

wherein $X^-$ represents $BF_4^-$, $PF_6^-$, $AsF_6^-$ or $SbF_6^-$ and R represents an alkyl group.

(15) The energy-ray curing resin composition as described in any of the above items (1) to (14), further comprising a photo-thermopolymerization initiator which can initiate polymerization by both light and heat as the photopolymerization initiator component described above.

(16) The energy-ray curing resin composition as described in any of the above items (1) to (15), comprising a sulfonium salt represented by the following Formula (IV), (IV') or (V) as the photopolymerization initiator component described above:

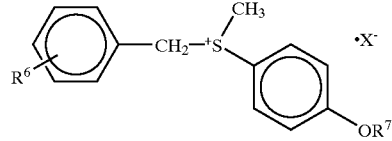

(IV)

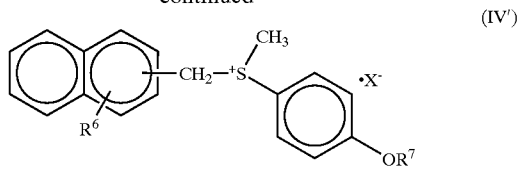

in Formula (IV) or (IV') described above, $R^6$ represents hydrogen, halogen, a nitro group or a methyl group; $R^7$ represents hydrogen, $CH_3CO$ or $CH_3OCO$; and $X^-$ represents $SbF_6^-$, $PF_6^-$, $AsF_6^-$ or $BF_4^-$;

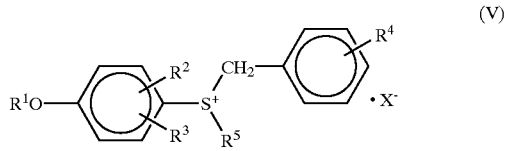

in Formula (V) described above, $R^1$ represents hydrogen, a methyl group, an acetyl group or a methoxycarbonyl group; $R^2$ and $R^3$ represent independently hydrogen, halogen or an alkyl group of $C_1$ to $C_4$; $R^4$ represents hydrogen, halogen or a methoxy group; $R_5$ represents an alkyl group of $C_1$ to $C_4$; and $X^-$ represents $SbF_6^-$, $PF_6^-$, $AsF_6^-$ or $BF_4^-$.

(17) The energy-ray curing resin composition as described in any of the above items (1) to (16), wherein the photopolymerization initiator component described above comprises a photopolymerization initiator comprising a binary or higher system containing a photopolymerization initiator and a photo-thermopolymerization initiator.

(18) The energy-ray curing resin composition as described in the above item (17), wherein the polymerization initiator component comprising the binary or higher system described above contains at least one of aryl base sulfonium salts or the iron-allene base compounds represented by Formula (I), (II) or (III) described above as the photopolymerization initiator and at least one of the sulfonium salts represented by Formula (IV) or (V) described above as the photo-thermopolymerization initiator.

(19) The energy-ray curing resin composition as described in the above item (17) or (18), wherein the polymerization initiator component comprising the binary or higher system described above contains the photo-thermopolymerization initiator in a proportion of 10 to 100% by weight.

(20) The energy-ray curing resin composition as described in any of the above items (1) to (19), wherein the photopolymerization initiator component described above is contained in a proportion of 0.1 to 6.0 parts by weight per 100 parts by weight of all the components excluding the photopolymerization initiator component.

The resin composition of the present invention solves the subjects and problems described above and shows a high curing characteristic by having the structures of (1) to (20) described above, and these characteristics (effects) can be applied to all other energy-ray curing resin compositions according to the compositions (1) to (20) described above. In general, an energy-ray curing resin composition contains a photocurable resin component and a photopolymerization initiator component. Accordingly, in the items (1) to (20) described above, the some components present in the energy-ray curing resin composition (for example, the photopolymerizable resin component and the photopolymerization initiator component) ca be substituted for an energy-ray curing resin composition so as to satisfy the items (1) to (20) described above, whereby other energy-ray curing resin compositions can be provided with the same characteristics (for example, a highly curable characteristic). To be specific, for example, (i) added to an energy-ray curing resin composition is a curing agent component which is capable of curing at least one of photopolymerizable resin components contained in the above energy-ray curing resin composition without irradiation of an energy ray, such as room temperature or heat curing, whereby the curing capacity is improved;

(ii) added to the above energy-ray curing resin composition are the curing agent component described in the above item (i) and a curing accelerator component which accelerates curing when curing at least one of the photopolymerizable resin components and the above curing agent component contained in the above energy-ray curing resin composition without irradiation of an energy ray, such as room temperature or heat curing, whereby the curing capacity is improved;

(iii) when the energy-ray curing resin composition contains an epoxy resin component having a cyclic ether structure in a molecular structure, added to the above energy-ray curing resin composition is a curing agent component which is capable of curing at least one of the above epoxy resin components without irradiation of an energy ray, such as room temperature or heat curing, so as to improve the curing capacity, and further added to the above energy-ray curing resin composition is a curing accelerator component which accelerates curing when curing at least one of the above epoxy resin components and the above curing agent component, so as to improve the curing capacity;

(iv) the curing agent component described in the above items (i) to (iii) may contain an acid anhydride or a derivative thereof, so as to improve the curing capacity;

(v) the curing agent component described in the above items (i) to (iii) may contain monohydric or polyhydric alcohols, so as to improve the curing capacity;

(vi) an acid anhydride or a derivative thereof and monohydric or polyhydric alcohols may be contained as the curing agent component or the curing accelerator component described in the above item (ii) or (iii), so as to improve the curing capacity;

(vii) the curing agent component or the curing accelerator component described in the above items (iii) to (vi) may comprise a compound which can react with the epoxy resin component and which does not have a nitrogen atom in its molecular structure, so as to improve the curing capacity;

(viii) maleic anhydride or a derivative thereof is contained as the acid anhydride or derivative thereof described in the above item (iv) or (vi), so as to improve the curing capacity;

(ix) polyethylene glycol may be contained as an alcohol described in the above item (v) or (vi), so as to improve the energy-ray curing capacity; and (x) a photo-thermopolymerization initiator is added to the above energy-ray curing resin composition in addition to (i) to (ix), whereby the curing capacity is improved.

Further, the object of the present invention can effectively be achieved by providing the following products:

(21) An energy-ray curing resin-molded article, including a resin-cured matter and a resin product, obtained by curing the energy-ray curing resin composition as described in any of the above items (1) to (20) using any curing technique such as irradiation with an energy ray, room temperature curing or heat curing.

(22) A paste material, including a magnetic paste, a conductive paste, a solder, a metal paste, an inorganic paste and a rib paste (for a thin display panel), comprising the energy-ray curing resin composition as described in any of the above items (1) to (20).

(23) A composite molding material, including a molding material, an injection-molding material, a filler (an inorganic filler, an organic filler and a metallic filler), a packing material, a fiber-reinforced composite material (a glass fiber, a carbon fiber, an inorganic fiber, an organic fiber and a metallic fiber), and a grinding stone material (an abrasive grain binder), comprising the energy-ray curing resin composition as described in any of the above items (1) to (20).

(24) An adhesive, including a sealing material, comprising the energy-ray curing resin composition as described in any of the above items (1) to (20).

(25) A coating material such as vanishes, insulating vanishes, sealing materials for diodes, IC, capacitors, electronic board and the like, paints, toners or inks, comprising the energy-ray curing resin composition as described in any of the above items (1) to (20).

That is, to sum up, the present invention relates to the high curability energy-ray curing resin composition comprising a photopolymerizable resin component and a photopolymerization initiator component which are the essential components of the energy-ray curing resin composition, and in addition thereto, a curing agent component as another essential component, which is capable of curing at least one of the above photopolymerizable resin components without irradiation of an energy ray, by way of room temperature and heat curing ,etc., the high-curability energy-ray curing resin composition comprising, in addition to this resin composition, the curing accelerator component which is a component for making it possible to accelerate the curing reaction thereof when curing it without irradiation of an energy ray, for example, by way of room temperature or heat curing, a method in which added to the energy-ray curing resin composition are the curing agent component which is capable of curing at least one of the resin components contained in the above energy-ray curing resin composition without irradiation of an energy ray, for example, by way of room temperature or heat curing, and the curing accelerator component which is a component for making it possible to accelerate a curing reaction of the above resin component and the curing agent component, whereby an energy-ray curing capacity of the energy-ray curing resin composition is improved, the resin-molded articles and the applied materials (paste materials, composite materials, adhesives, coating materials and the like) using these specific energy-ray curing resin compositions, and the applicable materials. In particular, preferably contained are an epoxy resin as the photopolymerizable resin component, which is excellent in physical properties and has many kinds of curing agents therefor, an acid anhydride or an acid anhydride derivative represented by maleic anhydride as the curing agent component, and monohydric or polyhydric alcohols represented by polyethylene glycol as the curing accelerator component. Further, the present invention relates to a composition percentage of the curing agent component and a composition percentage of the curing accelerator component.

Further, particularly preferably used as the photopolymerization initiator component is a cationic photo-thermopolymerization initiator or a photopolymerization initiator system comprising a binary or higher system of a photopolymerization initiator and a photo-thermopolymerization initiator. In particular, suitably used are the iron-allene compound types represented by Formulas (I) to (III) described above, phosphonium salt types, sulfonium salt types, the photo-thermopolymerization initiators represented by Formula (IV) and Formula (V) described above, and a polymerization initiator component comprising a binary or higher system containing at least one of the iron-allene compound types represented by Formula (I) to (III) described above, sulfonium salt types and aryl base sulfonium salt types (triaryl sulfonium salts) and at least one of the photo-thermopolymerization initiators represented by Formulas (IV) to (V). The present invention relates to percentage compositions of the polymerization initiator component comprising the binary or higher system described above.

Further, the present invention is to improve still further the curing capacity of the energy-ray curing resin composition by adding the specific components described above to the structural components of the resin composition, and it relates to a cured matter, a molded article and a product using the above resin composition, a production process for the above resin composition by an energy-ray curing method, and a utilization method therefor.

BRIEF DESCRIPTION OF THE DRAWINGS

FIG. 1 is a drawing showing one example of a production flow (production flow 1) in producing the resin composition of the present invention.

FIG. 2 is a drawing showing an example of other production flows in producing the resin composition of the present invention; (a) shows a production flow 2; (b) shows a production flow 3; and (c) shows a production flow 4.

DETAILED DESCRIPTION OF THE INVENTION

The present inventors have paid attention to the defects of conventional high curability energy-ray curing resin compositions associated with time and cost of developing resin compositions, and expensive materials used. Also, it is noted to be difficult to obtain suitable resin compositions for different uses. The present inventors noted that such problems are caused by development of a novel photopolymerization initiator, development of a light-sensitive agent and a photosensitizer related thereto, and development of a novel photopolymerizable oligomer. Further, they noted that the photocuring mechanism itself is the same as before and that if the curability is to be increased by improving apparatuses, advantages associated with energy-ray curing tend to be lost. They studied intensively to increase curing capacity using different resin composition components, such as a photopolymerization initiator, a light-sensitive agent, a photosensitizer and a photopolymerizable oligomer, which have not previously been studied using by combinations of resin compositions with new components, providing new mechanisms other than by conventional photocuring mechanisms, using inexpensive compositions for improved curing capacity and for controlling the characteristics of resins for different uses. As a result, they have developed a novel high curability energy-ray curing resin composition which has a higher curing capacity than those of conventional energy-ray curing resins and is inexpensive and which can easily be controlled in terms of resin characteristics and solves the problems of conventional high-curability energy-ray curing resin compositions, and a method for improving an energy-ray curing capacity, which is simple and has a high design freedom.

In this case, the energy ray includes a UV ray and in addition thereto, an electron beam, an X ray, an infrared ray, sunlight, a visible ray, various lasers (excimer laser, $CO_2$ laser, argon laser and the like) and a heat ray (emission and radiation). As shown by the characteristic of the resin composition that the developed high curable energy-ray curing resin composition contains a curing agent component, it can be cured by heat as well as light and electromagnetic wave as energy to be given. Further, in view of such characteristic of the resin composition, it is effective to heat the resin composition in advance to such an extent that it is not fully cured for improving the characteristic of energy-ray curing.

First, developed were a high curability energy-ray curing resin composition comprising as essential components, a so-called photopolymerizable resin component usable for energy-ray curing such as a photopolymerizable oligomer or a photopolymerizable monomer, a photopolymerization initiator component which makes it possible to cure the above resin composition by an energy ray and a curing agent component which is capable of curing at least one of the above resin components without irradiation of an energy ray, such as room temperature or heat curing, a high curability energy-ray curing resin composition comprising, in addition to the above high curability energy-ray curing resin composition, a curing accelerator component which makes it possible to accelerate the curing reaction when curing the above resin component and the above curing agent component by heat, a method in which added as an essential component to an energy-ray curing resin composition (for example, existing energy-ray curing resin compositions, related materials and novel energy-ray curing resin compositions) is a curing agent component which is capable of in curing at least one of the resin components, particularly the photopolymerizable resin components contained in the above energy-ray curing resin composition without irradiation of an energy ray, such as room temperature curing or heat curing, so that the curing capacity of the energy-ray curing resin composition is improved, and a method in which added to an energy-ray curing resin composition is a curing accelerator component which make it possible to accelerate the curing reaction when curing the above resin component and the above curing agent component by heat curing, so that the curing capacity of the energy-ray curing resin composition is improved. In the present invention, effective as well are those obtained by adding a suitable photoinitiator component to a curing resin composition, including related materials, to provide it with an energy-ray curing characteristic.

The compositions described above make it possible to combine material design techniques using different photopolymerizable resin components, fillers, additives and the like, which have so far been most often used for controlling the physical properties of an energy-ray curing resin, with choices of curing agents and curing accelerators which are generally known for heat curing, for obtaining desire physical properties. The present invention provides a wider range of design choices and techniques.

The curing capacity of the energy-ray curing resin composition comprising the respective components described above is improved due to the following reasons: First, when irradiating the energy-ray curing resin composition with an energy ray, the photopolymerizable resin composition is cured by virtue of the photopolymerization initiator component and in this case, heat produced in curing is radiated. Next, heat curing is brought about between the photopolymerizable resin composition and the curing agent component receiving this heat.

Different curing mechanisms of the energy-ray curing and heat curing described above function almost at the same time, and a shortage of curing is supplemented by these mechanisms in some cases. Thus the integrated curing capacity is improved according to the present invention as compared to curing with energy rays only.

Capable of being given as examples of the photopolymerizable resin component are various acrylates represented by, for example, epoxy acrylate, epoxidized oil acrylate, urethane acrylate, polyester acrylate, polyether acrylate, vinyl acrylate and polystyrylethyl methacrylate, various epoxies represented by alicyclic epoxy, glycidyl ether type epoxy, bisphenol A type epoxy and novolak type epoxy, various photopolymerizable oligomers such as unsaturated polyester, polyene/thiol, silicon, polybutadiene, vinyl ether compounds and epoxidized polyolefin, and various photopolymerizable monomers such as epoxy monomers, acryl monomers, vinyl ether and cyclic ethers. However, it shall not be restricted to them. Capable of being given as examples of the photopolymerization initiator component are radical photopolymerization initiators, cationic photopolymerization initiators and anionic photopolymerization initiators, though different in an aptitude depending on the aimed photopolymerizable resin component, for example, compounds of a diazonium salt type as shown in the following Table 1, compounds of a iodonium salt type as shown in the following Table 2, compounds of a pyridinium salt type represented by the following formula:

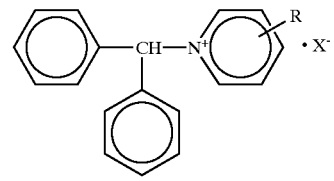

compounds of a phosphonium salt type as shown in Japanese Patent Application Laid-Open No. 6-157624 and Japanese Patent Application Laid-Open No. 7-82283, compounds of a sulfonium salt type as shown in the following Table 3, the compounds of an iron-allene compound type represented by Formula (I), (II) and (III) described above, compounds of a sulfonic acid ester type, the photo-thermopolymerization initiators represented by Formula (IV) and (V) described above, P1 type photopolymerization initiators shown in the following Table 4, P2 type photopolymerization initiators shown in the following Table 5, and optical base-generating agents such as Co-amine complexes, o-acyloximes, benzyloxycarbonyl derivatives and formamide. However, it shall not be restricted to them.

In recent years, reported was a cationic photopolymerization initiator in which an anionic part is tetrakis (pentafluorophenyl)borate $B(C_6F_5)_4^-$, which has a good performance as compared with those of conventional representatives (for example, antimony tetrafluoride $SbF_6^-$), and further increase in the performance by this can be expected. The details of these resin components and photopolymerization initiators and fillers and additives described later can be referred to "UV Ray Curing System(UV Koka Shisutemu)" written by S. Kato, published by Sogo Gijutsu Center (Feb. 28, 1988), "Optically Functional Material(Dai 6 Kan, Hikarikinou Zairyo)" edited by High Molecular Institute, Kyoritsu Shuppan Co., Ltd. (Jun. 15, 1991), Course material entitled "Trend of Photoinitiator in UV Curing and How to Select and Use (UV Koka Niokeru Hikari Kaishizai No Doko To Erabikata Tsukaikata" lectured by S. Kato, sponsored by Techno Forum Co., Ltd. (Nov. 27, 1992), and Course material entitled "Recent Technical Trend of Optical Cross-Linking System and Application—Chemistry of Photoacid-Base-Generating Agent and Application in Polymer Material System (Saikin No Hikari Kankyo Shisutemu No Gijyutsu Doko To Sono Oyo)" lectured by M. Kadooka, sponsored by Enterprise Service Training Association (Sep. 17, 1996).

The curing agent component may vary depending on the corresponding resin component, and capable of being given as examples thereof are, for example, epoxies and isocyanates when the photopolymerizable resin component contains a hydroxyl group and amines, acid anhydrides and polyols when it contains an epoxy group. However, it shall not be restricted thereto. It is important here that a relation in which curing (chemical reaction) other than energy-ray curing such as room temperature curing and heat curing is possible is set up between the curing agent component and at least one of the photopolymerizable resin components, which are essential components. The curing agent component, the photopolymerizable resin component and the photoinitiator component each may comprise plural components.

Even if in a certain case, a positional relation between the curing agent component and the photopolymerizable resin component is replaced, and the photopolymerizable resin component is positioned as the curing agent component (usually, a principal component of the composition is the resin component and a subsidiary component thereof is the curing agent component, but they are reversed, and when a principal component of the composition is the curing agent component and a subsidiary component thereof is the photopolymerizable resin component (in this case, the photopolymerization initiator component is then related to the subsidiary component)), it depends on the present invention as long as the relation described above is set up. It is no problem that the curing agent component for some one kind of the photopolymerizable resin component is a photopolymerizable resin component. In particular, when both of the principal component and the curing agent component are photopolymerizable resin components, the photopolymerization initiator component may be suited to at least one of the principal component and the curing agent component. Accordingly, material design having wide energy-ray curing characteristics including the advantage that the selective area is broad is possible.

Further, other components may be added to the resin component of the present invention comprising the respective essential components and, for example, other photopolymerizable resin components having no relation with the essential curing agent component and a photopolymerization initiator component related thereto may be added.

The curing accelerator component is varied as well depending on the photopolymerizable resin component and the curing agent component, and capable of being given as examples thereof are, for example, monohydric or polyhydric alcohols and acid anhydrides for amines and monohydric or polyhydric alcohols and amine for acid anhydrides. However, it shall not be restricted thereto. It is important here that the curing accelerator component which is an essential component has a function for accelerating a curing reaction (chemical reaction) which can take place between the curing agent component and at least one of the photopolymerizable resin components described above which are the essential components.

In this case, other components and the curing accelerator component each may comprise plural components as is the case with the curing agent component. In some cases, considered are the case where the curing accelerator component has the functions of the curing agent component and the photopolymerizable resin component and the case where the photopolymerization initiator component has the function of the curing agent component which is defined in the present invention (in this case, a curing agent component may not separately be added). In any cases, however, it depends on the present invention as long as the curing reaction-accelerating function described above is held. In general, in he case of the components (substances) functioning either as a curing agent component or a curing accelerator component, positioning of the above components (substances) is distinguished in many cases by a proportion of the components contained in the composition. For example, in the case of the component (6) described above, an acid anhydride acts as the curing agent component when the acid anhydride has a larger proportion, and alcohols act as the curing accelerator component. On the other hand, when the alcohols have a larger proportion, the alcohols act as the curing agent component, and the acid anhydride acst as the curing accelerator component. When the amounts of both are large, both sides have both functions. In addition thereto, when both the curing accelerator component and the curing agent component can react with at least one of the photopolymerizable resin components, easier curing can be expected. Further, other components may be added to the resin component of the present invention comprising the respective components described above and, for example, other photopolymerizable resin components having no relation with the curing agent component and the curing accelerator component and a photopolymerization initiator component related thereto may be added.

Specific examples of the high curability energy-ray curing resin composition include, for example a resin composition comprising epoxy acrylate (photopolymerizable resin component), a radical base photopolymerization initiator (photopolymerization initiator component), an acid anhydride (curing agent component) and polyol (curing accelerator component), a resin composition comprising epoxy acrylate and an epoxy resin (photopolymerizable resin components), a radical base photopolymerization initiator and a cationic photopolymerization initiator (photopolymerization initiator components) and an acid anhydride (curing agent component), a resin composition comprising an epoxy resin (photopolymerizable resin component), a cationic photopolymerization initiator (photopolymerization initiator component), an acid anhydride (curing agent component) and polyol (curing accelerator component), and a resin composition comprising an epoxy resin (photopolymerizable resin component), an anionic photopolymerization initiator (photopolymerization initiator component), amines (curing agent component) and an acid anhydride (curing accelerator component). However, it shall not be restricted thereto.

It is important for the material design described above to avoid curing inhibition from being caused between various components contained in the resin composition, particularly between the photopolymerization initiator component and other components. For example, amines which are a curing inhibition substance for a cationic photopolymerization initiator have to be avoided from being used when using the cationic photopolymerization initiator.

TABLE 1

Aryldiazonium salt photoinitiator

| Cation part (diazonium) | Anion part | Maximum wavelength (nm) |
|---|---|---|
| 2,5-Diethoxy-4-(p-toluyl-mercapto) benzene | $BF_4^-$ | 355.391 |
| 2,4-Dichlorobenzene | $SnCl_6^-$ | 285 |
| p-Nitrobenzene | $FeCl_4^-$ | 243,257 310,360 |
| p-Chlorobenzene | $PF_6^-$ | 273 |
| p-(N-morpholino) benzene | $AsF_6^-$ | 257,378 |
| 2,5-Dichlorobenzene | $SbF_6^-$ | 238,358 |
| o-Nitrobenzene | $BCl_6^-$ | 285,313 |

TABLE 2

Aromatic iodonium salt photoinitiator

| | Cation part | Anion part | λ MAX(nm) | ε MAX |
|---|---|---|---|---|
| 1. | 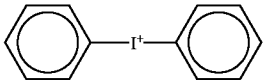 | $BF_4^-$ | 227 | 17,800 |
| 2. | 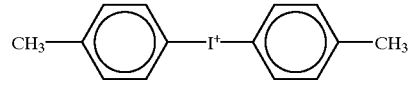 | $BF_4^-$ | 236 | 18,000 |
| 3. | 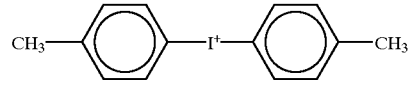 | $BF_4^-$ | 237 | 18,200 |
| 4. | 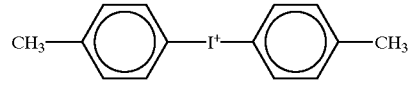 | $AsF_4^-$ | 237 | 17,500 |
| 5. | 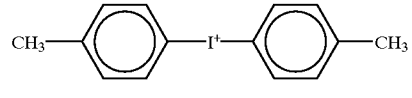 | $BF_4^-$ | 238 | 20,800 |
| 6. | 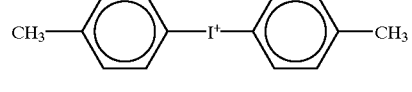 | $PF_6^-$ | 238 | 20,000 |
| 7. | 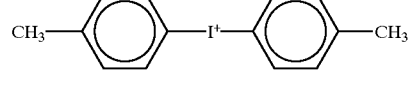 | $AsF_6^-$ | 238 | 20,700 |
| 8. |  | $SbF_6^-$ | 238 | 21,200 |

TABLE 3

Triaryl sulfonium salt photoinitiator

| | Cation part | Anion part | λ MAX(nm) | ε MAX |
|---|---|---|---|---|
| 1. | 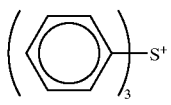 | $BF_2^-$ | 230 | 17,500 |

TABLE 3-continued

Triaryl sulfonium salt photoinitiator

| | Cation part | Anion part | λ MAX(nm) | ε MAX |
|---|---|---|---|---|
| 2. |  | AsF$_6^-$ | 230 | 17,500 |
| 3. | 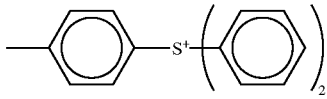 | PF$_6^-$ | 237<br>240 | 20,400<br>19,700 |
| 4. |  | AsF$_6^-$ | 225<br>280 | 21,740<br>10,100 |
| 5. | 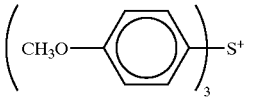 | BF$_2^-$ | 243<br>278 | 24,700<br>4,900 |
| 6. | 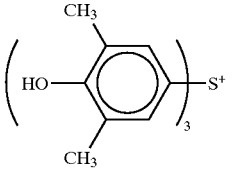 | AsF$_6^-$ | 263<br>280<br>316 | 25,200<br>22,400<br>7,700 |

TABLE 4

P1 type photoinitiator

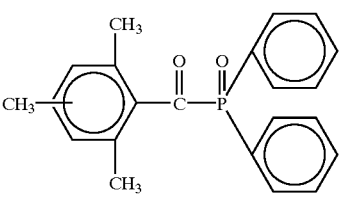 (acetophenone structure)

| Name | R | R$_1$ | R$_2$ | R$_3$ |
|---|---|---|---|---|
| Benzoin butyl ether | H | OC$_4$H$_9$ | H | C$_6$H$_5$ |
| Benzyl dimethyl ketal | H | OCH$_3$ | OCH$_3$ | C$_6$H$_5$ |
| Ethoxyacetophenone | H | OC$_2$H$_5$ | OC$_2$H$_5$ | H |
| Acyloxime ester | H | NOCO | CH$_3$ | C$_6$H$_5$ |
| | H | NOCO | OC$_2$H$_5$ | CH$_3$ |
| Chlorinated acetophenone | C$_4$H$_9$ | Cl | Cl | Cl |
| Hydroxyacetophenone | H | OH | CH$_3$ | CH$_3$ |

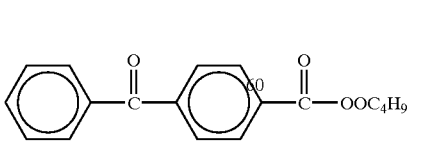

Acylphosphine oxide

TABLE 5

P2 type photoinitiator

R—[ring]—R₁ (thioxanthone structure)

| Name | X | R | R₁ |
|---|---|---|---|
| Benzophenone | — | R | H |
| Michloer's ketone | — | (CH₃)₂N | (CH₃)₂N |
| Dibenzosuberone | CH₂—CH₂ | H | H |
| 2-Ethylanthraquinone | C=O | H | 2-C₂H₅ |
| Isobutylthioxanthone | S | H | 2-I-C₃H₇ |

Benzyl

In particular, from the viewpoints that many kinds of the curing agent component and the curing accelerator component are available and the cured matters have good physical properties, an epoxy resin component is preferred as the photopolymerizable resin component, and 3,4-epoxycyclohexylmethyl-3,4-epoxycyclohexanecarboxylate is particularly preferred.

Acid anhydrides or derivatives of acid anhydrides and monohydric or polyhydric alcohols are particularly preferred as the curing agent component or the curing accelerator component. The acid anhydrides include, for example, compounds shown in Table 6, and the monohydric or polyhydric alcohols include compounds having a hydroxyl group in a chemical structure, such as phenols, novolaks, glycols, alcohols and polyols. They are particularly preferred in the case of the epoxy resin described above.

TABLE 6

Examples of acid anhydrides

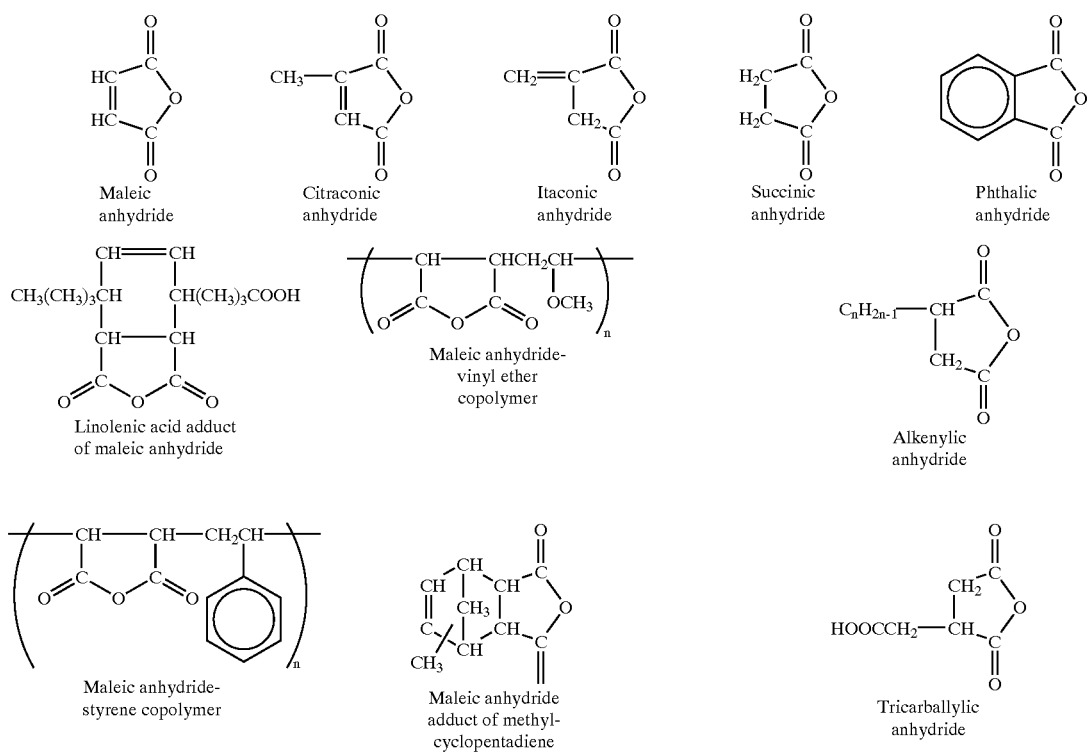

TABLE 6-continued

Examples of acid anhydrides

Chlorendic acid

Alkylated endoalkylene-tetrahydrophthalic anhydride

Dodecenylsuccinic anhydride

Methyl-disubstituted-butenyltetrahydo-phthalic anhydride

Hexahydophthalic anhydride

Ethylene glycol bis-trimellitate

Methyltetrahydrophthalic anhydride

Pyromellitic anhydride

Glycerin trimellitate

Cyclopentane-tetracarboxylic anhydride

Benzophenone-tetracarboxylic anhydride

When the epoxy resin component is used as the photopolymerizable resin component, considered as the curing agent component and the curing accelerator component are compounds having a functional group which can react with an epoxy group (a carboxylic anhydride group, a carboxylic acid group, a hydroxyl group, an amine group, an amide group, a urethane group, a urea group, an isocyanate group and in addition thereto, functional groups described in Table 7). Capable of being given as general examples are amines, amides (polyamides), acid anhydrides and phenols as the curing agent component, and acid anhydrides, polyols and amines as the curing accelerator component. In particular, preferred are compounds comprising the components of acid anhydrides or derivatives of acid anhydrides and monohydric or polyhydric alcohols. Also, compounds containing no nitrogen atom in a molecular structure of such components are preferred in making a material design since it is less liable to bring about curing inhibition when they are combined with a cationic photopolymerization initiator.

The details of the epoxy resin and kinds and combinations of the curing agent component and the curing accelerator component can be referred to "Epoxy Resin (Epoxy Jushi)" edited by H. Kakiuchi, published by Shokodo Co., Ltd. and "Epoxy Resin—Recent Progress(Epoxy Jushi—Saikin No Shinpo)" edited and written by H. Kakiuchi, published by Shokodo Co., Ltd. (May 30, 1990).

In particular, maleic anhydride or a derivative thereof is preferred as an acid anhydride from a viewpoint of a price, a reactivity and characteristics, and particularly preferred is the resin composition comprising 3,4-epoxycyclohexylmethyl-3,4-epoxycyclohexanecarboxylate, maleic anhydride or a derivative thereof and a cationic photopolymerization initiator. In particular, polyethylene glycol is preferred as monohydric or polyhydric alcohols from a viewpoint of reaction control, molecular weight control and characteristic control, and particularly preferred is the resin composition comprising 3,4-epoxycyclohexyl-methyl-3,4-epoxycyclohexanecarboxylate, maleic anhydride or a derivative thereof, polyethylene glycol and a cationic photopolymerization initiator.

TABLE 7

Examples of functional group capable of reacting with epoxy group

| Reagent | → | Product |
|---|---|---|
| $H_2O$ Water | | 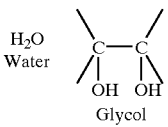 Glycol |
| $HNO_3$ Nitric acid | | Nitric ester (OH, $ONO_2$) |
| $NH_3$ Ammonia | | Amino-Alcohol (OH, $NH_2$) |
| HCN Hydrogen cyanide | | Cyan-hydrin (OH, CN) |
| $C_6H_5OH$ Phenol | | Hydroxy-phenyl ether (OH, $OC_6H_5$) |
| RMgX Grignard Reagent | | Alcohol (OH, R) |
| RCHO, $R_1COR$ Aldehyde ketone | | Acetal |
| $PCl_3$ Phosphorus trichloride $C_6H_5$ Benzene | | $P(OCH_2CH_2Cl)_3$ Tri-Hydrogen ester (OH, ø) Alcohol |

TABLE 7-continued

Examples of functional group capable of reacting with epoxy group

| Reagent | → | Product |
|---|---|---|
| NaOH Alkali fusion | | $R(COOH)_2$ Dibasic acid |
| HCl Hydro-chloric acid | | Chorohydrin (OH, Cl) |
| RCOOH Organic | | Hydroxy-ester (OH, OCOR) |
| $R_2NH$ Secondary amine | | Amino-alcohol (OH, $NR_2$) |
| $Na_2SO_3$ Sodium sulfite | | Hydroxy-sulfonic acid (OH, $SO_3Na$) |
| ROH Alcohol | | Hydroxy-ether (OH, OR) |
| $H_2$ Hidrogen | | Alcohol (OH, H) |
| C≡CNa Sodium acetylide | | Acetylene alcohol (OH, C≡CH) |
| $H_2S$ Hydrogen disulfide | | Hydroxy-thiol (OH, SH) |
| $CH_3COCl$ Acetyl chloride | | Chloro-ester (Cl, $OCOCH_3$) |

TABLE 7-continued

Examples of functional group capable of reacting with epoxy group

Reagent → Product

RSH Mercaptan → Hydroxythioether (structure showing C—C with OH and SR substituents)

Further, with respect to a composition proportion of the resin composition, the curing agent component has preferably a proportion of 0.1 to 1.4 mol per mol of the resin component which can react with the curing agent component, and the curing agent component has particularly preferably a proportion of 0.3 to 1.0 mol per mol of the resin component which can react with the curing agent component. In the case of heat curing, a proportion of the resin component to the curing agent component can stoichiometrically be decided to some extent, and if a range thereof is exceeded, it becomes difficult to obtain the cured matter having good physical properties. On the other hand, in the case of energy-ray curing, curing is advanced with the resin component alone by virtue of the photopolymerization initiator. The present invention has both characteristics of energy-ray curing and heat curing. Accordingly, if the curing agent component falls outside the range described above and is too small, the curing capacity-elevating effect which is the characteristic of the present invention (almost simultaneous progress of different curing mechanisms of energy-ray curing and heat curing caused by heat produced in the above curing and prevention of a shortage in curing) brought about by a curing mechanism other than irradiation with an energy ray is hard to be displayed. In contrast with this, if it is too large, the resin component required for energy-ray curing is relatively reduced, so that a reduction in the energy-ray curing capacity and a reduction in the heat amount produced by curing are bought about, and the curing characteristics are reduced. Also, when it is exceeds a stoichiometric limit, it becomes difficult to obtain the cured matter having good physical properties.

The curing accelerator component has preferably a proportion of 0.04 to 0.6 mol per mol of the curing agent component, and the curing accelerator component has particularly preferably a proportion of 0.08 to 0.4 mol per mol of the curing agent component. If the curing accelerator component falls outside the range described above and is too small, an accelerating effect of the curing reaction can not be displayed. On the other hand, if it is too large, more curing reaction-accelerating effect than in adding the optimum amount can not be expected, and it is not rather preferred since brought about are a slowdown in the curing reaction, an inhibition of the energy-ray curing and a waste of the heat amount generated by curing.

A cationic photopolymerization initiator is particularly preferred as the photopolymerization initiator which is an essential component. In particular, the iron-allene base compounds represented by Formula (I), (II) and (III) are preferred since if it is contained in the resin composition of the present invention, the curing characteristic is elevated to a large extent. For example, the resin composition comprising 3,4-epoxycyclohexyl-methyl-3,4-epoxycyclohexanecarboxylate, maleic anhydride and the compound represented by Formula (I) described above is improved in a curing capacity to such an extent that it is easily cured by sunlight and shows a high curing characteristic.

Further, a photo-thermopolymerization initiator is preferably used as well. In particular, if the sulfonium salt represented by Formula (IV), (IV') or (V) is contained in the resin composition of the present invention, the curing characteristic is elevated to a large extent, and a chain curing reaction which has so far been difficult without using a binary photopolymerization initiator becomes possible with a single polymerization initiator.

For example, the resin composition comprising 3,4-epoxycyclohexyl-methyl-3,4-epoxycyclohexanecarboxylate, maleic anhydride and the compound represented by Formula (IV) is improved in a curing capacity to such an extent that it is easily cured only by containing 0.5 wt % of the compound represented by Formula (IV) and shows a high curing characteristic.

Further, preferred is a photopolymerization initiator comprising a binary or higher system comprising components of a photopolymerization initiator and a photo-thermopolymerization initiator. In particular, the photopolymerization initiator comprising a binary or higher system comprising an aryl base sulfonium salt type or at least one of the iron-allene base compounds represented by Formula (I), (II) and (III) and at least one of the sulfonium salts represented by Formula (IV), (IV') and (V) elevates the curing characteristic to a large extent by using for the resin composition of the present invention.

For example, the resin composition comprising 3,4-epoxycyclohexyl-methyl-3,4-epoxycyclohexanecarboxylate, maleic anhydride and the photopolymerization initiator comprising the binary or higher system described above is improved in a curing capacity and shows a high curing characteristic, so that it readily brings about a chain curing reaction.

Further, preferred is a photopolymerization initiator obtained by adding a suitable thermopolymerization initiator (for example, prenyl tetramethylenesulfonium hexafluoroantimonate and the like) to a photopolymerization initiator, a photo-thermopolymerization initiator and the photopolymerization initiator comprising the binary or higher system described above, and easier curing can be expected from an improvement in the heat curing capacity.

Further, with respect to a composition proportion of the resin composition, the photopolymerization initiator has preferably a proportion of 0.1 to 6.0 parts by weight, particularly preferably 0.5 to 3.0 parts by weight per 100 parts by weight of the whole weight of the other components than the photopolymerization initiator. If the photopolymerization initiator has a proportion of less than 0.1 part by weight, the effect thereof is scarcely shown, and the small amount to the whole makes the initiator itself less liable to function. On the other hand, if the proportion exceeds 6.0 parts by weight, the photocuring capacity itself does not change.

The photo-thermopolymerization initiator constituting the photopolymerization initiator comprising a binary or higher system accounts preferably for 10 to 100 wt %, particularly preferably 20 to 80 wt % in terms of a weight ratio. In a conventional photopolymerization initiator comprising a binary or higher system, a photo-thermopolymerization initiator has preferably a weight ratio of 50 to 80 wt %. In the present invention, however, the function of chain curing is displayed even in the percentage described above. However, if the weight ratio is small, the characteristic of chain curing tends to be less liable to be displayed, and if the weight ratio is large, the chain curing tends to be less liable to be controlled.

Further, capable of being added to the resin composition in a curable range is at least one of conventionally used additives such as energy ray-shielding materials (for example, carbon and carbon fiber (short fiber, long fiber, continuous fiber, carbon cloth and the like), an inorganic filler and metal powder), various fillers, an organic component, a light-sensitive agent, a reactive diluent, a photosensitizer and an acid-increasing agent. The resin composition and the curing capacity-elevating method of the present invention can be applied to various cured matters, molded articles, produced matters, for examples, molding materials, injection-molding materials, filler-packaging materials, fiber-reinforced composite materials, carbon fiber-reinforced composite materials, other composite materials, paste materials, adhesives, shielding materials, vanishes, paints or coating materials, inks or toners.

Next, the production process for the energy ray-cured resin composition of the present invention shall be explained.

The production process for the resin composition of the present invention includes, for example, a production flow 1 shown in FIG. 1 or production flows 2 to 4 shown in FIG. 2, but the production process for the resin composition of the present invention shall not be restricted to them. That is, the resin composition comprising the essential components of the present invention is better finally obtained, and the temperature, the stirring time, the presence of shielded light and the adding order can suitably be determined according to, for example, the composition and the characteristics of the resin composition produced.

When the respective components of the curing agent component, the curing accelerator component and the photopolymerization initiator component have a high reactivity with the photopolymerizable resin composition, particularly when the reactivity to a temperature is high and the curing can be advanced at a room temperature for short time, the reaction is carried out preferably at a low temperature while stirring considering so that the reaction does not proceed. When stirring solid matters or less soluble components, stirring for long time or treatment in which they are dissolved in advance in a solvent are preferred.

When the photopolymerization initiator component can easily be optically reacted in a production environment or it takes long time from adding the photopolymerization initiator component to completion of the production, light shielding and replacement of the addition order are effective. The curing reaction is initiated and advanced or a side-reaction takes place in a certain case depending on the addition order, and in such case, replacement of the addition order is effective as well. The resin composition of the present invention has a high curability and can be cured by both of heat and an energy ray, so that it is important to determine the production conditions so that the curing reaction does not take place.

One example of the production process shall be explained below with reference to the production flow shown in FIG. 1.

The respective compositions used for producing the resin composition of the present invention are represented by a component A, a component B, a component C, a component D, a component E and a component F. The component A represents a photopolymerizable resin component; the component B represents a curing agent component; the component C represents a photopolymerization initiator component; the component D represents a curing accelerator component; the component E represents other additive components such as a light-sensitive agent, a photosensitizer and a stabilizer; and the component F represents other components such as a reactive diluent, a diluent, a pigment and a filler.

Among them, the components A to C are essential components, and therefore all of the respective mixed components following a mixed component 2 are the resin compositions of the present invention in an example of the production flow 1. The respective components consist of plural kinds and therefore are represented by affixing numerals to small alphabetic letters by the number of the kinds constituting the respective components. For example, when the component A consists of three kinds, the three kinds are represented by a1, a2, and a3 respectively. For the sake of convenience, it has been assumed in the production flow 1 that all components consist of three kinds. In this case, in order to make it easy to understand the production process, more specific production procedure and apparatuses used shall be shown, but the present invention shall by no means be restricted by the methods and the apparatuses used here.

First, a prescribed amount of the component A (a1, a2 and a3) and a prescribed amount of the component B (b1, b2 and b3) are added to a flask in one lot and stirred at a revolution of 300 rpm at a room temperature for about one hour by means of a propeller type stirring blade to dissolve them (mixed component 1). It is a matter of course that capable of being employed are a process in which the component A and the component B each are put in advance into one, and they are stirred at a revolution of 300 rpm at a room temperature by means of the propeller type stirring blade until the component B is completely dissolved and a process in which the component B is added to the component A by each kind and stirred at a revolution of 300 rpm at a room temperature by means of the propeller type stirring blade until the component B is completely dissolved. When the component A and the component B can be cured at a room temperature, particularly when they can be cured for short time, the component A, the component B and the mixed component thereof are better maintained at a temperature (for example, 0° C. or lower) at which curing can be prevented and inhibited. Addition is better slowly carried out.

Next, prescribed amounts of c1, c2 and c3 are filled into a sample bottle together with a good solvent so that the concentration becomes 50 wt % and stirred on the conditions of light shielding and a room temperature for one hour by means of a stirrer to completely dissolve c1, c2 and c3 to put them in advance into one. This is added to the mixed component 1 in one lot and stirred at a revolution of 300 rpm at a room temperature for about 0.2 hour under light shielding by means of the propeller type stirring blade to completely dissolve them (mixed component 2). It is a matter of course that capable of being employed is a process in which a prescribed amount of the component C (c1, c2 and c3) is added to the mixed component 1 in one lot or the component C is added to the mixed component 1 by every kind and stirred at a revolution of 300 rpm at a room temperature under light shielding by means of the propeller type stirring blade until the component C is completely dissolved. When the mixed component 1 has a high reactivity with the component C as is the case with in preparing the mixed component 1, particularly when a photo-thermopolymerization initiator component is contained in the component C and the reactivity to heat is high, the mixed component 1, the component C and the mixed component thereof are better maintained at a temperature (for example, 0° C. or lower) at which curing can be prevented and inhibited. Addition is better slowly carried out.

Prescribed amounts of d1, d2 and d3 are stirred at a revolution of 300 rpm at a room temperature for 0.5 hour by means of the propeller type stirring blade to put them in advance into one. This is added to the mixed component 2 in one lot and stirred at a revolution of 300 rpm at a room temperature for about 0.2 hour under light shielding by means of the propeller type stirring blade to completely dissolve them (mixed component 3). It is a matter of course that capable of being employed is a process in which a prescribed amount of the component D (d1, d2 and d3) is added to the mixed component in one lot or the component D is added to the mixed component 2 by every kind and stirred at a revolution of 300 rpm at a room temperature under light shielding by means of the propeller type stirring blade until the component D is completely dissolved. When the mixed component 2 has a high reactivity with the component D or when a photo-thermopolymerization initiator component is contained in the mixed component 2 and the reactivity to heat is high, so that a reaction of the mixed component is liable to be initiated by adding the component D, the mixed component 2, the component D and the mixed component thereof are better maintained at a temperature (for example, 0° C. or lower) at which curing can be prevented and inhibited. Addition is better slowly carried out.

Further, prescribed amounts of e1 and e2 (when e3 is a stabilizer) are filled into a sample bottle together with a good solvent so that the concentration becomes 50 wt % and stirred on the conditions of light shielding and a room temperature for one hour by means of a stirrer to completely dissolve e1 and e2 to put thrm in advance into one. This is added to the mixed component 3 in one lot and stirred at a revolution of 300 rpm at a room temperature for about 0.2 hour under light shielding by means of the propeller type stirring blade to completely dissolve them. The component e3 (when e3 is a stabilizer) is added thereto and stirred at a revolution of 300 rpm at a room temperature under light shielding by means of the propeller type stirring blade until e3 is completely dissolved (mixed component 4). It is a matter of course that capable of being employed is a process in which a prescribed amount of the component E (e, e2 and e3) is added to the mixed component 4 in one lot or prescribed amounts of e1 and e2 are added to the mixed component in one lot and then e3 is added, or the component E is added to the mixed component 3 by every kind and stirred at a revolution of 300 rpm at a room temperature under light shielding by means of the propeller type stirring blade until the component E is completely dissolved. When the mixed component 3 has a high reactivity with the component E or when a photo-thermopolymerization initiator component is contained in the mixed component 3 and the reactivity to heat is high, so that a reaction of the mixed component is liable to be initiated by adding the component E, the mixed component 3, the component E and the mixed component thereof are better maintained at a temperature (for example, 0° C. or lower) at which curing can be prevented and inhibited. Addition is better slowly carried out. Further, it is considered to replace an adding order of the component D and the component E and add the component D after adding the component E to the mixed component 2 or add the component E at the same time as the component C. The stabilizer in the component E is aimed at an inhibition in the reactivity of the resin composition under storage and a rise in the pot life and preferably finally added in a certain case in order to prevent the curing reactivity and the stability effect from being extremely lost.

Finally, prescribed amounts of the component F (f1, f2 and f3) are added to a mixed component 4 in one lot and stirred at a revolution of 300 rpm at a room temperature for about one hour under light shielding by means of the propeller type stirring blade to prepare a resin composition. It is a matter of course that capable of being employed is a process in which prescribed amounts of the components F each are put in advance into one and then added to the mixed component 2 or the component F is added to the mixed component 4 by every kind and stirred at a revolution of 300 rpm at a room temperature for about one hour by means of, for example, the propeller type stirring blade. Also, when considered is reaction initiation caused by adding the component F and stirring, for example, reaction initiation caused by heat generated in stirring, the mixed component 4, the component F and the mixed component thereof are better maintained at a temperature (for example, 0° C. or lower) at which curing can be prevented and inhibited. Addition is better slowly carried out. The component F is a component which is necessary when the resin composition of the present invention is practically used for various uses making the best use thereof, and a process in which it is added immediately before practically using can be employed.

With respect to a manner for adding the respective components, the addition amounts are different depending on a reactivity of the added components with the receiving side in the production. When the reactivity is high, it is basic to slowly add the components while taking care of a rise in the temperature of the mixture so that the temperature is maintained low, and when the reactivity is low, it is no problem to add the components in one lot. However, an example of a method for mixing high reactive solutions themselves includes a method in which the solutions are dispersed in an instant by stirring at a high rate to prevent the reaction. Further, when the component comprising plural kinds is added, each of the plural kinds may be added one by one or the plural kinds which are put together into one may be added or the plural kinds may be added at the same time. However, a stabilizer and a reactive diluent used for finally adjusting the viscosity may be added separately depending on the kind and the use, and those which are less liable to be dissolved are better dissolved in advance in a good solvent in a certain case. Basically, light shielding has to be done for all those containing an optically reactive component. In the production flows 2 to 4, the addition order in the production flow 1 is changed. To be basic, the temperature is low considering so that the reaction does not proceed; the stirring time is extended until the components are completely dissolved at the respective stirring steps; and light shielding is provided from after adding the optically reactive materials to completion of the production. In the production flow 3, however, the component C (photopolymerization initiator component) is added to the mixed component having a high curability, and therefore it is considered that a curing reaction is liable to take place as compared with the others. It is preferred to reduce the temperature (for example, 0° C. or lower) by cooling and slowly add the components as well as shielding light.

Considering to put the resin composition of the present invention to practical use, it is enough to finally obtain a resin composition containing the resin composition of the present invention until actually curing the resin composition. Accordingly, it is allowed that without producing the resin composition having a single liquid state containing the essential components from the beginning, the resin composition is produced at first separating into two or more different compositions and that they are mixed and stirred before practically used and cured. Examples of component division thereof are shown in the following Table 8 but shall not be restricted thereto, and various cases can be considered from the kinds and the percentages of the components used, the storage conditions and the production conditions.

TABLE 8

| Division example No. | Division pattern | Divided solution 1 | Divided solution 2 | Divided solution 3 |
|---|---|---|---|---|
| ① | 2 solutions | A | B + C + D + E | |
| ② | 3 solutions | | B | C + D + E |
| ③ | | A | B + D | C + E |
| ④ | | A | B + C + E | D |
| ⑤ | 2 solutions | A + C + E | B + D | |
| ⑥ | | A + B + D | C + E | |
| ⑦ | | A + B | C + D + E | |
| ⑧ | 3 solutions | a1 + B | a2 + D | C + E |

In the table, the structural components and the structural kinds of the resin composition are represented by the component A (structural kinds: a1 and a2), the component B, the component C and the component E. When the component F is added, it is added basically to a side containing the component A having more blending amount, but it is inverted in a certain case.

Division of the components has the advantage that the storage stability is improved as is the case with conventional two-liquid curing resins. On the other hand, a labor of stirring is increased in an actual work.

It can be found from the results obtained in Examples 1 to 21 and Comparative Examples 1 to 7 that the energy-ray curing resin composition which is improved in a curing capacity and has an excellent high curability can readily be obtained according to the resin composition of the present invention.

That is, the present invention makes it possible to provide the energy-ray curing resin composition which has a very high curing capacity as compared with those of conventional energy-ray curing resins and which is simple and has a high design freedom. The resin composition of the present invention can be applied to various cured matters, molded articles, produced matters, for examples, molding materials, fiber-reinforced composite materials, carbon fiber-reinforced composite materials, other composite materials, adhesives, shielding materials, vanishes, paints or coating materials, inks or toners.

The present invention shall be explained below in further details with reference to examples, but the present invention shall by no means be restricted by these examples.

EXAMPLE 1

Maleic anhydride 0.65 mol was added to one mol of Celoxide 2021P (alicyclic epoxy resin; 3,4-epoxycyclohexylmethyl-3,4-epoxycyclohexane-carboxylate, manufactured by Daicel Chemical Co., Ltd.) and dissolved by stirring to obtain a solution. Blended with 100 parts by weight of the above solution was 1.5 part by weight of IRGACURE 261 which is ($\eta^5$-2,4-cyclopentadien-1-yl)[1,2,3,4,5,6-$\eta$)-(1-methylethyl) benzene]-iron($1^+$)-hexafluorophosphate($1^-$) (iron-allene base photopolymerization initiator; Formula (I), manufactured by Ciba Geigy Co., Ltd.). (A)

A glass vessel (ø40 mm×H50 mm) was charged with 50 g of (A). This was exposed to sunlight (April, around 1 o'clock afternoon, clear). (B)

The sample described above was completely cured within 10 minutes.

EXAMPLE 2

Maleic anhydride 0.65 mol was added to one mol of Celoxide 2021P and dissolved by stirring to obtain a solution. Blended with 100 parts by weight of the above solution was 1.0 part by weight of Sun Aid SI-80L (cationic photo-thermopolymerization initiator; Formula (IV) 50 wt %+solvent 50 wt %, trace amount of additive, manufactured by Sanshin Chemical Co., Ltd.). (C)

A glass vessel (ø40 mm×H50 mm) was charged with 50 g of (C). This was irradiated with UV for 3 minutes. The irradiation conditions were a UV irradiation apparatus: UVL-1500M2 (manufactured by Ushio Denki Co., Ltd.), the kind of a lamp: metal halide lamp, a lamp intensity: 120 W/cm, a lamp length: 125 mm, in the air, at room temperature, under atmospheric pressure and an irradiation distance: 15 cm. (D)

The sample described above was completely cured in several minutes while chain curing.

EXAMPLE 3

The same test as in Example 2 was carried out, except that 0.5 part by weight of Sun Aid SI-60 (cationic photo-thermopolymerization initiator; Formula (IV), manufactured by Sanshin Chemical Co., Ltd.) was blended in place of Sun Aid SI-80L.

The sample described above was completely cured in several minutes while chain curing.

EXAMPLE 4

Maleic anhydride 0.65 mol was added to one mol of Celoxide 2021P and dissolved by stirring to obtain a solution. Blended with 100 parts by weight of the above solution was 1.0 part by weight of Irugacure 261 and 1.0 part by weight of Sun Aid SI-60L (cationic photo-thermopolymerization initiator; Formula (IV)/solvent=1/2, trace amount of additive, manufactured by Sanshin Chemical Co., Ltd.). (E)

A glass vessel (ø40 mm×H50 mm) was charged with 50 g of (E) and exposed to sunlight as was the case with (B) in Example 1.

The sample described above was completely cured in several minutes while chain curing.

EXAMPLE 5

A glass vessel (ø40 mm×H50 mm) was charged with 50 g of (E) prepared in Example 4 and irradiated with UV in the same manner as in Example 2 (D).

The sample described above was completely cured in several minutes while chain curing.

EXAMPLE 6

The blending amount of the photopolymerization initiator in (E) of Example 4 was changed to 1.0 part by weight of Irugacure 261 and 0.5 part by weight of Sun Aid SI-60L, and a glass vessel (ø40 mm×H50 mm) was charged with 50 g thereof and irradiated with UV in the same manner as in Example 2 (D).

The sample described above was completely cured in several minutes while chain curing.

EXAMPLE 7

The blending amount of the photopolymerization initiator in (E) of Example 4 was changed to 0.5 part by weight of IRGACURE 261 and 1.0 part by weight of Sun Aid SI-60L and a glass vessel (φ40 mm×H50 mm) was charged with 50 g thereof and irradiated with UV in the same manner as in Example 2 (D).

The sample described above was completely cured in several minutes while chain curing.

EXAMPLE 8

In the resin composition of (E) prepared in Example 4, 0.65 mol of maleic anhydride was changed to 0.3 mol, and a glass vessel (ø40 mm×H50 mm) was charged with 50 g thereof and irradiated with UV in the same manner as in Example 2 (D).

The sample described above took more time for curing than in Example 5 but was completely cured in several minutes while chain curing.

EXAMPLE 9

In the resin composition of (E) prepared in Example 4, 0.65 mol of maleic anhydride was changed to 0.65 mol of hexahydrophthalic anhydride, and a glass vessel (ø40 mm×H50 mm) was charged with 50 g thereof and irradiated with UV in the same manner as in Example 2 (D).

The sample described above took more time for curing than in Example 5 but was completely cured in several minutes while chain curing.

EXAMPLE 10

In the resin composition of (E) prepared in Example 4, 0.65 mol of maleic anhydride was changed to 0.3 mol of polyethylene glycol (average molecular weight: 300), and a glass vessel (ø40 mm×H50 mm) was charged with 50 g thereof and irradiated with UV in the same manner as in Example 2 (D).

The sample described was completely cured in several minutes while chain curing.

EXAMPLE 11

The photopolymerization initiator used in (E) of Example 4 was changed to 0.3 part by weight of DAICAT 11 (aryl base sulfonium salt type/solvent=1/1, manufactured by Daicel Chemical Co., Ltd.) and 0.7 part by weight of Sun Aid SI-80L, and a glass vessel (ø40 mm×H50 mm) was charged with 50 g thereof and irradiated with UV in the same manner as in Example 2 (D).

The sample described above was completely cured in several minutes while chain curing.

EXAMPLE 12

Blended were 1.0 part by weight of Irugacure 261 and 1.0 part by weight of Sun Aid SI-60L with 100 parts by weight of Celoxide 2021P/maleic anhydride/polyethylene glycol 300 (mole ratio: 1.0/0.65/0.17). (F)

A glass vessel (ø40 mm×H50 mm) was charged with 50 g of (F) and irradiated with UV in the same manner as in Example 2 (D).

The sample described above was completely cured in several minutes while chain-curing more easily than in Example 5.

EXAMPLE 13

In the resin composition of (F) prepared in Example 12, a mole ratio of polyethylene glycol 300 was changed to 0.085, and a glass vessel (ø40 mm×H50 mm) was charged with 50 g thereof and irradiated with UV in the same manner as in Example 2 (D).

The sample described above took more time for curing than in Example 12 but was completely cured in several minutes while chain-curing more easily than in Example 5.

EXAMPLE 14

In the resin composition of (F) prepared in Example 12, a mole ratio of polyethylene glycol 300 was changed to 0.65, and a glass vessel (ø40 mm×H50 mm) was charged with 50 g thereof and irradiated with UV in the same manner as in Example 2 (D).

The sample described was completely cured in several minutes while chain-curing. The sample cured had a low hardness as compared with that of Example 12 and strongly showed a property as rubber

EXAMPLE 15

Blended were 0.072 part by weight of Irugacure 261, 0.288 part by weight of DAICAT 11 and 0.504 part by weight of Sun Aid SI-60 with 100 parts by weight of Celoxide 2021P/ Celoxide 2000 (photopolymerizable diluent; cyclohexenevinyl monoxide, manufactured by Daicel Chemical Co., Ltd.)/maleic anhydride/hexahydrophthalic anhydride/polyethylene glycol 300 (mole ratio: 0.95/0.05/0.48/0.16/0.145). Polyethylene glycol 300 was added lastly in preparing. (G)

A glass vessel (ø40 mm×H50 mm) was charged with 50 g of (G) and irradiated with UV in the same manner as in Example 2 (D).

The sample described above was completely cured in several minutes while chain-curing.

EXAMPLE 16

A resin composition was prepared in the same manner, except that the photopolymerization initiator used in (G) of Example 15 was changed to 0.1 part by weight of IRGACURE 261, 0.2 part by weight of DAICAT 11 and 0.7 part by weight of Sun Aid SI-60L, and a glass vessel (ø40 mm×H50 mm) was charged with 50 g thereof and irradiated with UV in the same manner as in Example 2 (D).

The sample described above was completely cured in several minutes while chain curing.

EXAMPLE 17

A rein composition was prepared in the same manner, except that the photopolymerization initiator used in (G) of Example 15 was changed to 0.2 part by weight of IRGACURE 261, 0.8 part by weight of DAICAT 11 and 1.4 part by weight of Sun Aid SI-60. (H)

A glass vessel (ø40 mm×H50 mm) was charged with 50 g of (H) and irradiated with UV in the same manner as in Example 2 (D).

The sample described above was completely cured faster than in Example 15 while vigorously chain curing.

EXAMPLE 18

A resin composition was prepared in the same manner, except that Celoxide 2021P used in (H) of Example 17 was changed to ARALDITE AER 260 (bisphenol A type liquid epoxy resin: manufactured by Asahi Ciba Co., Ltd.), and a glass vessel (ø40 mm×H50 mm) was charged with 50 g thereof and irradiated with UV in the same manner as in Example 2 (D).

The sample described above was completely cured in several minutes while chain curing.

EXAMPLE 19

A glass test tube (ø15 mm×H150 mm) was charged with (G) prepared in Example 15 up to a height of 120 mm and irradiated with UV in the same manner as in Example 2 (D), except that an irradiation distance was changed to 10 cm.

The sample described above was completely cured in several minutes while chain curing.

EXAMPLE 20

A copper tube (ø19 mm×L500 mm) filled with a non-woven fabric of carbon fiber was charged with the same resin composition as (H) prepared in Example 17, and one end thereof was sealed with a rubber stopper. It was irradiated in the same manner as in Example 2 (D), except that changed were an irradiation distance to 10 cm and an irradiation time to 5 minutes.

The sample described above was completely cured in several hours while chain curing.

EXAMPLE 21

A copper tube (ø19 mm×L500 mm) filled with a non-woven fabric of carbon fiber was charged with the same resin composition as (G) prepared in Example 15, and one end thereof was sealed with a rubber stopper. This was stored in an oven maintained at 70° C. for 2 hours and taken out.

The sample described above was cured as well by heat.

Comparative Example 1

Prepared was a resin composition comprising 100 parts by weight of Celoxide 2021P and 1.5 part by weight of IRGACURE 261 (a composition obtained by removing maleic anhydride from (A) prepared in Example 1), and a glass vessel (ø40 mm×H50 mm) was charged with 50 g thereof. This was exposed to sunlight as was the case with (B) prepared in Example 1.

The sample described above was not cured even after exposed to sunlight for 5 hours.

Comparative Example 2

Prepared was a resin composition comprising 100 parts by weight of Celoxide 2021P and 1.0 part by weight of Sun Aid SI-80L (a composition structure obtained by removing maleic anhydride from (C) prepared in Example 2), and a glass vessel (ø40 mm×H50 mm) was charged with 50 g thereof.

This was irradiated with UV in the same manner as in Example 2 (D).

The sample described above did not cause chain-curing and was cured only on a surface thereof, and the remainder was not cured.

Comparative Example 3

Prepared was a resin composition comprising 100 parts by weight of Celoxide 2021P and 1.0 part by weight of Sun Aid SI-60 (a composition structure obtained by removing maleic anhydride from the resin composition prepared in Example 3), and a glass vessel (ø40 mm×H50 mm) was charged with 50 g thereof.

This was irradiated with UV in the same manner as in Example 2 (D).

The sample described above did not cause chain-curing and was cured only on a surface thereof, and the remainder was not cured.

Comparative Example 4

Prepared was a resin composition comprising 100 parts by weight of Celoxide 2021P, 1.0 part by weight of IRGACURE 261 and 0.5 part by weight of Sun Aid SI-60L (a composition structure obtained by removing maleic anhydride from the resin composition prepared in Example 6), and a glass vessel (ø40 mm×H50 mm) was charged with 50 g thereof.

This was irradiated with UV in the same manner as in Example 2 (D).

The sample described above did not cause chain-curing and was cured only on a surface thereof, and the remainder was not cured.

Comparative Example 5

Prepared was a resin composition comprising 100 parts by weight of Celoxide 2021P, 0.3 part by weight of DAICAT 11 and 0.7 part by weight of Sun Aid SI-80L (a composition structure obtained by removing maleic anhydride from the resin composition prepared in Example 11), and a glass vessel (ø40 mm×H50 mm) was charged with 50 g thereof.

This was irradiated with UV in the same manner as in Example 2 (D).

The sample described above had a distinctly low curing capacity as compared with that of Example 11.

Comparative Example 6

Prepared was a resin composition comprising 100 parts by weight of Celoxide 202 P/Celoxide 2000 (mole ratio: 0.95/0.05), 0.072 part by weight of IRGACURE 261, 0.288 part by weight of DAICAT 11 and 0.504 part by weight of Sun Aid SI-60 (comparative object: Example 15), and a glass vessel (ø40 mm×H50 mm) was charged with 50 g thereof. This was irradiated with UV in the same manner as in Example 2 (D).

The sample described above had a distinctly low curing capacity as compared with that of Example 15.

Comparative Example 7

Prepared was a resin composition comprising 100 parts by weight of Celoxide 2021P/Celoxide 2000 (mole ratio: 0.95/0.05), 0.1 part by weight of Irugacure 261, 0.2 part by weight of DAICAT 11 and 0.7 part by weight of Sun Aid SI-60L (comparative object: Example 16), and a glass vessel (ø40 mm×H50 mm) was charged with 50 g thereof. This was irradiated with UV in the same manner as in Example 2 (D).

The sample described above had a distinctly low curing capacity as compared with that of Example 16.

What is claimed is:

1. An energy-ray curing resin composition comprising a photopolymerizable resin component which can be cured by irradiation with an energy ray, a photopolymerization initiator component which makes it possible to cure said photopolymerizable resin component with irradiation of an energy ray, and a curing agent component capable of curing at least one of said photopolymerizable resin components without irradiation of an energy ray, wherein said curing agent component comprises an acid anhydride, said photopolymerization initiator component comprises ($\eta^5$-2,4-Cyclopentadien-1-yl)[(1,2,3,4,5,6-$\eta$)-(1-methylethyl)benzene]-iron(1+)-hexafluorophosphate (1−); and said curing agent component is present with a proportion of 0.1 to 1.4 mol per mol of said photopolymerizable resin component which can react with said curing agent component.

2. The energy-ray curing resin compononent as described in claim 1, further comprising a curing accelerator component which accelerates curing when curing at least one of said photopolymerizable resin components and said curing agent component without irradiation of an energy ray.

3. The energy-ray curing resin composition as described in claim 2, comprising an epoxy resin component having a cyclic ether structure in a molecular structure as the photopolymerizable resin component.

4. The energy-ray curing resin composition as described in claim 2, comprising a monohydric or polyhydric alcohol as the curing accelerator component.

5. The energy-ray curing resin composition as described in claim 3, wherein said curing accelerator component comprises a compound which can react with the epoxy resin component and which does not have a nitrogen atom in a molecular structure.

6. The energy-ray curing resin composition as described in claim 3, comprising 3,4-epoxycyclohexylmethyl-3,4-epoxycyclohexanecarboxylate as the photopolymerizable resin component.

7. The energy-ray curing resin composition as described in claim 1, comprising maleic anhydride as the acid anhydride.

8. The energy-ray curing resin composition as described in claim 4, comprising polyethylene glycol as the alcohols.

9. The energy-ray curing resin composition as described in claim 2, wherein the curing accelerator component is present with a proportion of 0.04 to 0.6 mol per mol of the curing agent component.

10. The energy-ray curing resin composition as described in claim 1, further comprising a photo-thermopolymerization initiator which can initiate polymerization by both of light and heat.

11. The energy-ray curing resin composition as described in claim 10, wherein the photo-thermopolymerization initiator comprises a sulfonium salt.

12. The energy-ray curing resin composition as described in claim 10, wherein ($\eta^5$-2,4-cyclopentadien-1-yl)[1,2,3,4,5,6-$\eta$)-(1-methylethyl)benzene]-iron($1^+$)-hexafluorophosphate($1^-$) is present in a proportion of 10 to 100% by weight.

13. The energy-ray curing resin composition as described in claim 1, wherein the photopolymerization initiator component is contained in a proportion of 0.1 to 6.0 parts by weight per 100 parts by weight of the total weight of the components excluding the photopolymerization initiator component.

14. An energy-ray curing resin-molded article obtained by curing the energy-ray curing resin composition as described in claim 1.

15. A paste material comprising the energy-ray curing resin composition as described in claim 1.

16. A composite molding material comprising the enrgy-ray curing resin composition as described in claim 1.

17. An adhesive comprising the energy-ray curing resin composition as described in claim 1.

18. A coating material comprising the energy-ray curing resin composition as described in claim 1.

* * * * *